(12) United States Patent
Baldauf et al.

(10) Patent No.: US 10,347,760 B2
(45) Date of Patent: Jul. 9, 2019

(54) RECONFIGURABLE NANOWIRE FIELD EFFECT TRANSISTOR, A NANOWIRE ARRAY AND AN INTEGRATED CIRCUIT THEREOF

(71) Applicants: Technische Universität Dresden, Dresden (DE); NaMLab gGmbH, Dresden (DE)

(72) Inventors: Tim Baldauf, Dresden (DE); André Heinzig, Dresden (DE); Walter Michael Weber, Dresden (DE)

(73) Assignees: Technische Universität Dresden, Dresden (DE); NaMLab gGmbH, Dresden (DE)

( * ) Notice: Subject to any disclaimer, the term of this patent is extended or adjusted under 35 U.S.C. 154(b) by 0 days.

(21) Appl. No.: 15/627,533

(22) Filed: Jun. 20, 2017

(65) Prior Publication Data

US 2018/0012996 A1    Jan. 11, 2018

(30) Foreign Application Priority Data

Jun. 20, 2016 (DE) .......... 10 2016 111 237

(51) Int. Cl.
*H01L 29/78* (2006.01)
*H01L 27/11* (2006.01)
(Continued)

(52) U.S. Cl.
CPC .......... *H01L 29/7839* (2013.01); *B82Y 10/00* (2013.01); *B82Y 40/00* (2013.01);
(Continued)

(58) Field of Classification Search
CPC ... H01L 29/78; H01L 29/783; H01L 29/7839; H01L 29/78391; H01L 29/66; H01L 29/668; H01L 29/665; H01L 29/6684; H01L 29/16; H01L 29/08; H01L 29/084; H01L 29/0847; H01L 29/06; H01L 29/067; H01L 29/0676; H01L 29/064; H01L 29/0649; H01L 27/11; H01L 27/115; H01L 27/1159
(Continued)

(56) References Cited

U.S. PATENT DOCUMENTS

| 9,209,246 B2 * | 12/2015 | Fonash ................ H01L 27/088 |
| 9,673,209 B2 * | 6/2017 | Colinge ............ H01L 27/11556 |
| 2011/0233512 A1 * | 9/2011 | Yang ..................... B82Y 10/00 |
| | | 257/9 |

* cited by examiner

*Primary Examiner* — Monica D Harrison
(74) *Attorney, Agent, or Firm* — Heslin Rothenberg Farley & Mesiti P.C.; Stephen Scuderi (57) ABSTRACT

A reconfigurable field effect transistor (RFET) includes a nanowire, wherein the nanowire comprises two Schottky contacts, as well as two gate contacts partially enclosing the nanowire in cross section. An integrated circuit can be produced therefrom. The aim of producing CMOS circuits with enhanced functionality and a more compact design is achieved in that the nanowire is divided along the cross section thereof into two nanowire parts, wherein each nanowire part comprises a respective Schottky contact and a respective gate contact, and the two nanowire parts are connected electrically to one another via a common substrate and stand vertically on the substrate. In a nanowire-parts-array, between the nanowire parts, a respective top-gate contact and/or back-gate contact can be formed in a substrate defining a substrate plane.

14 Claims, 8 Drawing Sheets

(51) Int. Cl.
*B82Y 40/00* (2011.01)
*H01L 21/283* (2006.01)
*H01L 29/47* (2006.01)
*H01L 29/06* (2006.01)
*H01L 29/08* (2006.01)
*H01L 29/16* (2006.01)
*H01L 29/66* (2006.01)
*B82Y 10/00* (2011.01)
*H01L 29/417* (2006.01)
*H01L 29/423* (2006.01)
*H01L 29/775* (2006.01)
*H01L 29/41* (2006.01)
*H01L 27/092* (2006.01)
*H01L 27/1159* (2017.01)
*H01L 21/8238* (2006.01)

(52) U.S. Cl.
CPC ........ *H01L 21/283* (2013.01); *H01L 29/0649* (2013.01); *H01L 29/0676* (2013.01); *H01L 29/0847* (2013.01); *H01L 29/16* (2013.01); *H01L 29/413* (2013.01); *H01L 29/41741* (2013.01); *H01L 29/42356* (2013.01); *H01L 29/47* (2013.01); *H01L 29/665* (2013.01); *H01L 29/6684* (2013.01); *H01L 29/775* (2013.01); *H01L 29/78391* (2014.09); *H01L 21/823814* (2013.01); *H01L 27/092* (2013.01); *H01L 27/1159* (2013.01)

(58) Field of Classification Search
USPC ........................................................ 257/295
See application file for complete search history.

RECONFIGURABLE NANOWIRE FIELD EFFECT TRANSISTOR, A NANOWIRE ARRAY AND AN INTEGRATED CIRCUIT THEREOF

CROSS REFERENCE TO RELATED APPLICATIONS

This application is a U.S. non-provisional application which claims priority to German Application No. 102016111237.2, filed on Jun. 20, 2016. The contents of the prior application is hereby incorporated by reference herein in its entirety.

BACKGROUND ART

The invention relates to a reconfigurable field effect transistor (RFET) comprising a nanowire, wherein the nanowire comprises two Schottky contacts and two gate contacts partially enclosing the nanowire along the outer periphery thereof.

The invention moreover relates to a nanowire-parts-array as well as to an integrated circuit which comprises the reconfigurable field effect transistors according to the invention.

To date, according to MOORE's law, the scaling of highly integrated circuits has halved the surface of the conventional components approximately every two years, and thus the number of components and the associated functionality of a circuit have doubled. However, conventional scaling of silicon-based planar CMOS field effect transistors (CMOS-FETs) has reached the physical limits. The transition to three-dimensional multigate structures (FinFETs) first of all ensures further scaling of the components and thus preserves MOORE's law. However, these FinFETs too cannot be made as small as desired and will reach their physical limits in the foreseeable future. Therefore, alternative approaches to increasing the integration and functionality in comparison to conventional scaling are urgently needed.

A possible alternative consists of the functional enhancement of circuit elements. Here, multifunctional devices with adaptable logic and computation blocks can be used, by means of which an increase in functionality can be ensured even beyond the end of conventional scaling according to MOORE.

However, the conventional CMOS circuits consisting of n-MOSFETs (electron-conducting) and p-MOSFETs (hole-conducting) are less suitable for this purpose, since the polarity of their transistors is predetermined by the production process thereof and the implanted resulting dopants used in the process are firmly fixed, and thus the circuit can no longer be changed subsequently.

Figure 1:
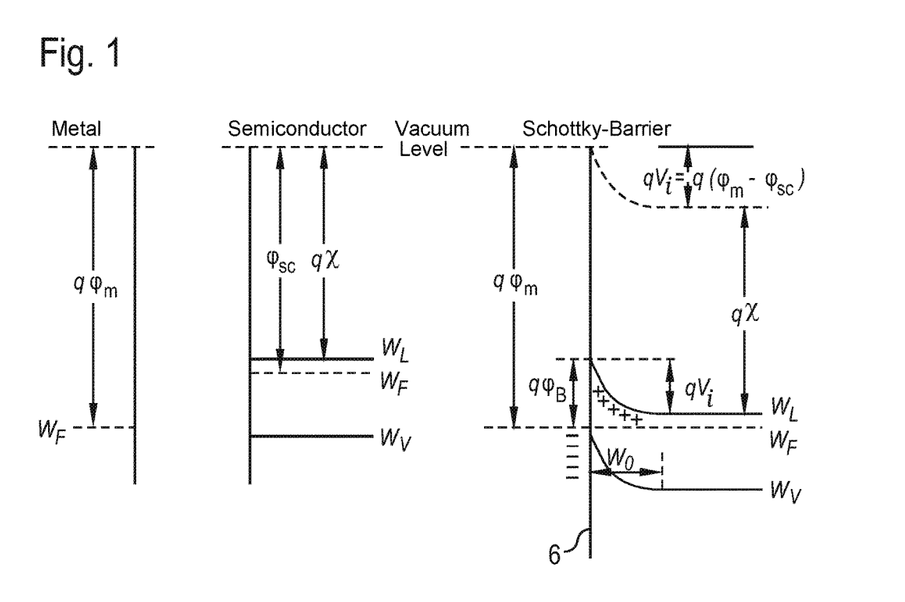
FIG. 1 a diagrammatic representation of a Schottky barrier.
Figure 2:
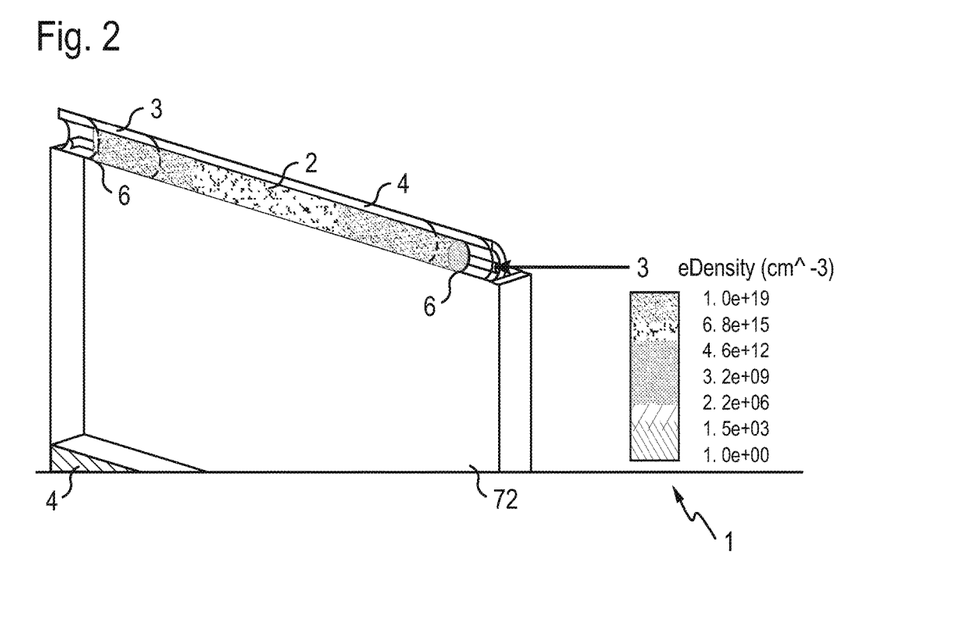
FIG. 2 a diagrammatic representation of a horizontally formed RFET.

However, the increase in functionality is known from horizontal reconfigurable field effect transistors (RFET). The reconfigurable field effect transistors are based on silicon nanowires lying horizontally on a substrate, with separately gated Schottky barriers. The term Schottky barriers is used to denote the boundary surface between a metal and a semiconductor. Here, in a simplified consideration, it can be assumed that a metal and a semiconductor can be assembled without any change in the electron structure due to the metal-semiconductor bonding in the solid made of metal and semiconductor. If one assumes that the work function of the metal $q^*\varphi_m$ is greater than the electron affinity of the semiconductor $q^*\chi$—a condition which is satisfied in most metal-semiconductor combinations—, then, on the boundary surface between the Fermi edge $W_F$ of the metal and the lower conduction band edge $W_L$ of the semiconductor, a potential step forms having a height $\varphi_B = \varphi_m - \chi$ that depends on the material combination. The Fermi energy $W_F$ of the undisturbed (for example, n-doped) semiconductor is just below the conduction band (except in degenerate semiconductors). In the case of contact between metal and semiconductor, charge compensation occurs, the Fermi energies of metal and semiconductor material converge, and, subsequently, there is only one common Fermi energy in the thermodynamic equilibrium. Due to the different work functions of the two materials, there is a charge effect on the two surfaces. On the metal surface, the "−" electrons accumulate, which flow out of the semiconductor surface and thus generate "+" positive interfering sites in the semiconductor. A potential wall and a "bending" of the bands of the semiconductor occur. Via band bending, the electrons are able to leave the semiconductor, and a so-called depletion zone $W_0$ forms, in which the potential energy of the electrons in the conduction band (majority charge carrier) is high. As explained, the electrons in the semiconductor have a higher energy state than the electrons in the metal. If positive voltage is then applied (negative pole on the n-type semiconductor), electrons are pushed from the semiconductor material into the depletion zone and the potential barrier becomes smaller. Electrons can then flow from the semiconductor into the metal ("forward direction," English forward bias). On the other hand, if one applies a negative voltage (which is not sufficiently large for a breakthrough to occur), the electrons are pulled even more strongly in direction of the metal, and the thickness of the depletion zone ("barring direction," English reverse bias) increases. Only a very low current occurs, because a few electrons of the metal can overcome the barrier due to thermal excitation, or "tunnel" through the barrier (quantum mechanical tunnel effect). The diagrammatic representations of a Schottky barrier and of a RFET are represented in FIGS. 1 and 2. Here, $W_V$ is the energy level of the valency band, $W_L$ is the lower energy edge of the conduction band, $\varphi_{sc}$ is the work function of the semiconductor, q is the electrical charge, and $V_l$ is the energy of the vacuum level.

In the case of the RFET, the source and drain contacts are each formed by a Schottky barrier, wherein a gate potential is used for the purpose of injecting the predominant charge carriers directly into the valency or conduction band at the site of band bending. FIG. 2 shows the electron density of a nanowire FET in the conductive state, wherein the transistor structure is represented cut in half along the longitudinal extent thereof.

In the case of silicon nanowires, the formation of a sharp, i.e., abrupt metal-semiconductor boundary surface can be implemented. In contrast to bulk materials, due to the small dimensions of the nanowires, the electrostatic control of the active areas (metal-semiconductor transitions) can occur substantially more simply and efficiently.

Figure 3:
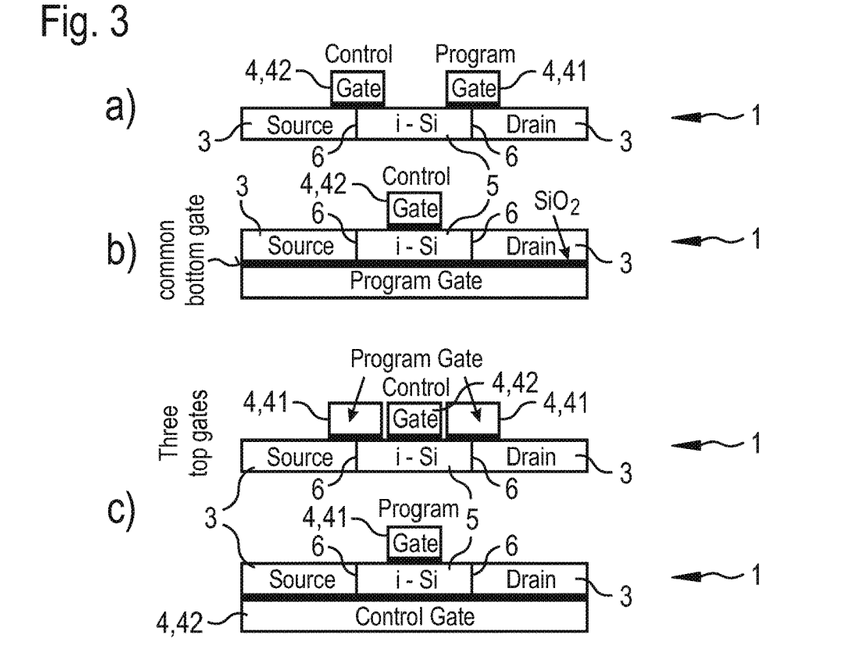
FIG. 3 a diagrammatic representation of three reconfigurable designs (A, B, C) known from the prior art.

Three different reconfigurable designs for nanowire FETs are known, which depend on the control of the charge carrier selection and the charge carrier concentration:

A) Selective charge carrier injection and concentration control on the contacts;
B) Selection of the polarity on the contacts, and control of the charge concentration in the channel;
C) Ambipolar operation with charge carrier filtering in the channel. The designs are represented diagrammatically in FIG. 3a) to c).

In case A), the selective charge carrier injection and the control of the charge carrier concentration occur directly on the source and drain contacts 3 of RFET 1. For this purpose, the Schottky barriers are gated independently of one another at the source and drain transitions 3, and no gate contact is necessary in the center of the channel. On the drain contact side, a gate contact can block the undesired charge carriers from entering into the channel, as a result of which the polarity of the RFET is programmed. On the source contact side, the other gate contact is used for setting the conductivity of the other charge carrier type (control of the RFET) (FIG. 3a)

In case B), the two Schottky transitions 6 are controlled at the same time, wherein either holes (Vg<0) or electrons (Vg>0) are accumulated in the channel, and thus the polarity of the RFET is programmed. Using an additional gate contact 42 in the center of the channel 5, the flow of the charge carriers from source contact to drain contact 3 can be set (controlled) (FIG. 3b).

In case C), the same structure as in case B) is used, except that the gate contacts 4 are controlled in a different manner. If the source and drain contact 3 are actuated at the same time via a common gate contact 42, an ambipolar characteristic is generated, as in a normal FET with a Schottky barrier. Using the gate contact 41 in the center, i.e., between the source contact and drain contact, the RFET is programmed, i.e., the undesired charge carriers in the center of the channel 5 are blocked by the applied voltage on this gate contact 41 (FIG. 3c).

The three cases described show how the polarity of the RFET can be changed by means of an additional programming gate, i.e., by means of the applied voltage on the program gate contact, a unipolar n- or p-type behavior can be programmed dynamically. Thus, the RFET can be operated both as an n- and also as a p-FET. This means that the reconfigurable nanowire transistors combine the electrical properties of unipolar n- and p-type field effect transistors in a single component, wherein the nanowire transistors are constructed according to the same technology, geometry and arrangement. Thus, it is not only possible to reduce the technical complexity, but the possibility is also opened for dynamic programming of circuit functions on the device level. This means that a finer reconfiguration of complex functions is possible. This enables a reconfigurability of the circuits and thus a higher functionality with constant number of components.

However, the disadvantage is that the horizontal RFETs take up much space due to the top gates (for example, in case A and B) which are in parallel, so that fewer components per surface can be implemented. A smaller active surface moreover leaves little room for the tolerance of some process steps, for example, the silicidation of the wires. In the field of nanotechnology, silicidation is understood to mean the sintering of a metal layer, for example, tungsten, titanium, tantalum or nickel, into a silicon substrate. In the silicidation, for example, with nickel, the nickel reacts by rapid thermal annealing, for example, at a temperature of 500° C., to the silicon, wherein the nickel penetrates into the silicon.

Therefore, the aim of the present invention is to overcome the above-mentioned disadvantages and make an improvement, wherein CMOS circuits with enhanced functionality are to be implemented, and a more compact design is to be achieved.

BRIEF SUMMARY OF THE INVENTION

The aim is achieved in terms of the arrangement in that the nanowire is divided along the cross section thereof perpendicularly to the longitudinal extent of the nanowire into nanowire parts, wherein each nanowire part comprises a respective Schottky contact and a respective gate contact, and the two nanowire parts are electrically connected to one another via a common substrate and formed so as to stand on the substrate.

In the nanowire parts that stand vertically on the substrate, the structure is also referred to as vertical integration of the RFET, since the field effect transistor formed from the nanowire does not lie horizontally on the substrate, instead the source and drain contacts of the field effect transistor, viewed from the substrate, are constructed vertically on said substrate. The respective gate contacts are also located spaced from the substrate on the upper end of the source or drain contact. However, these gate contacts do not have to be located directly on the end of a nanowire part, instead they can be arranged spaced from the substrate at any site, along the longitudinal extent of a nanowire part, i.e., the nanowire parts can extend beyond the gate contact. Due to the vertical arrangement, the scaling is not always bound to transistor length. In contrast to the conventional CMOSFET, the current, i.e., the current carriers which are injected via a Schottky barrier, reaches the contacts (source and/or drain contact) via the common substrate and thus also via areas which are not gated, since the charge transport is characterized primarily by diffusion of the charge carriers. In addition, in the case of the vertical integration, one is quite free to select the height of the components. This in turn makes room for tolerances such as overlapping of Schottky barrier and gate contact. The tapping of the source and/or drain contacts can occur over the entire length of the vertically standing nanowire parts.

Like the horizontal RFETs, the vertical ones as well, i.e., those that stand vertically on the substrate, are programmed by means of the program gate contact, i.e., whether they are formed to be p- or n-conducting, and controlled via the control gate contact (voltage-controlled current source).

Via the common substrate, any vertical wires can be combined to form a transistor, wherein at least two nanowire parts form a reconfigurable field effect transistor, but three nanowire parts can also form a reconfigurable field effect transistor. Any number of these nanowire parts can be arranged on a substrate, wherein the nanowire transistors can be interconnected to form a desired or intended logical function and programmed.

In addition, several vertical wires can already form a component, wherein the interconnection of the nanowires represents certain logical functions for any number of input signals, such as an OR function and a multiplexer (MUX) function.

It is advantageous that the gate contact is formed so as to completely enclose the nanowire part along an outer periphery thereof. The gate contact which completely encloses the nanowire part can be produced in a simple manner only by means of the vertical structure, wherein, due to the volume-closing surround gate, a better gate control is possible in comparison to the horizontally integrated omega gate, so that improved circuit properties are achieved. The name omega gate results from the fact that this contact, when viewed in cross section thereof, has the appearance of a capital Greek letter Ω.

The reconfigurability of the FET results from the fact that the Schottky contact is or will be formed from one of the nanowire parts as a function of an actuation of the respective gate contact and the potential ratio formed between the respective Schottky contacts either as drain contact or as source contact. Which Schottky contact is formed as drain or source contact depends accordingly on the drain source voltage, i.e., on the potential drops between the Schottky contacts forming an RFET. By means of the potential ratio described as well as the changeability and settability, the functioning of the respective Schottky contact can also be varied subsequently and is not firmly fixed by doping as in the case of a conventional CMOSFET, but variable.

In a design of the reconfigurable field effect transistor, the nanowire parts are made of silicon, and the substrate is formed as a silicon-on-isolator (SOI) substrate. The reconfigurable field effect transistors can also be implemented on a germanium substrate.

In a design of the reconfigurable RFET according to the invention, the common substrate (7) is implemented with a semiconducting layer, which is formed so as to be insulated from the rest of the substrate, on which the two nanoparts are formed so as to stand vertically.

In another advantageous design, the common substrate is implemented as a nanowire and as a part of the nanowire, on which the two nanowire parts are formed so as to stand vertically.

In terms of the arrangement, the aim is also achieved by a nanowire-parts-array, wherein the nanowire-parts-array consists of at least two nanowire parts according to the invention, which are electrically connected to one another via a common substrate and which are formed so as to stand vertically on the substrate. The common substrate, i.e., the substrate surface on which the nanowire parts are formed, can be structured via a shallow-trench isolation process step (STI process) on a wafer surface. For the nanowire-parts-array, between the nanowire parts, a respective top-gate contact and/or back-gate contact can be formed in a substrate defining a substrate plane. A top-gate contact is arranged on the substrate top side, i.e., on the side on which the nanowire parts are arranged, whereas a back-gate contact is arranged on the substrate back side, i.e., the side of the substrate facing away from the nanowire parts. The nanowire parts, arranged in the nanowire-parts-array with respective separately gated Schottky barriers, can be combined in any manner. These components, therefore, have an increased functionality and adjustability and generate a plurality of degrees of freedom for future implementation of circuits. Due to the adjustable interconnection it is possible, for example, to implement a component with logical functions, for example, OR function, MUX function, so that an increased functionality of a single circuit produced in hardware is achieved.

In a design of the nanowire-parts-array, the top-gate contacts and/or back-gate contacts are arranged linearly on the substrate plane, wherein more than two top-gate contacts and/or back-gate contacts cross forming a grid field, and, in a grid field area, a respective nanowire part is arranged. Therefore, a particularly high adjustability of the possibilities of combining and wiring the individual nanowire parts to one another and with respect to one another is possible. Due to the arrangement of a top-gate contact and/or a back-gate contact between two nanowire parts which form an RFET, for example, band bending can be generated, so that, depending on the function to be implemented, corresponding charge carriers can be prevented from being transported from one transistor contact to another or they can move freely.

Depending on the wiring of the nanowire parts via the respective gate contact and the potential ratios of the respective Schottky contacts with respect to one another, and also via the control of the top-gate contacts and/or back-gate contacts, the nanowire-parts-array is formed as an integrated logical circuit. Due to the respective actuation of the gate contacts and the potential ratios of the respective Schottky contacts with respect to one another, the functionality of the circuit can be changed and is not fixed permanently as in conventional integrated circuits in CMOS technology due to the doping which is performed once during the production process.

In a particular advantageous design of the nanowire-parts-array, the nanowire-parts-array is formed from an even or odd number of nanowire parts. Here, a single reconfigurable field effect transistor of the nanowire-parts-array can comprise either two or also three contacts. Moreover, in this way, a particularly adjustable actuation of the gate contacts as well as of the potential ratios of the respective Schottky contacts with respect to one another, and thus the functionality of the circuit can be implemented.

In terms of the arrangement, the aim is also achieved by an integrated circuit, wherein the integrated circuit comprises a reconfigurable field effect transistor (RFET) according to the invention and/or a nanowire-parts-array, which is formed from at least two of the nanowire parts according to the invention, which are electrically connected to one another via a common substrate and which are formed so as to stand on the substrate.

An integrated circuit according to is the present invention may be formed as a reconfigurable transistor circuit.

In terms of process, the aim of the present invention is achieved by a method for producing a reconfigurable field effect transistor, having the following steps:

First, a nanowire part is formed on a silicon-on-isolator (SOI) substrate. A germanium-on-isolator substrate is also possible. This can occur either by top-down etching, bottom-up growth or in-hole-growth. The structuring of the substrate surface for the individual forming RFETs occurs via a shallow-trench isolation process (STI). Before a gate oxide and a gate metal are deposited for the formation of a gate contact, which can be formed so as to completely enclose the nanowire part in cross section, a nonconductor (insulator), preferably a low-k material is applied as a spacer between the SOI substrate and the gate contact. For this purpose, tetraethyl orthosilicate (abbreviated: TEOS) can be used, for example. After the growth or deposition of the gate oxide, for the purpose of which, for example, $SiO_2$/HfO can be used as ferroelectric material, and the application of the gate metal (for example, TiN by atom layer deposition, ALD), a second low-k material, for example, TEOS again, is deposited between the gate contact and the Schottky contact which subsequently forms either the source contact or the drain contact. In the production method according to the invention, it is particularly advantageous that the silicidation of the Schottky contact is carried out as last production step. This simplifies the production and increases the reliability of the structure, since the need for subsequent process steps that have further influence on the silicides formed is dispensed with. In this way, a simple integration of the Schottky barriers is possible. Moreover, it is advantageous that the silicidation is self-limiting. Therefore, the position of the Schottky barriers with respect to an end—formed at a distance from the substrate—of the nanowire part standing vertically on the substrate is defined and set exactly.

For the dynamic reconfigurable actuation of a nanowire-parts-array, the top-gate contacts and/or back-gate contacts are exposed to a positive or a negative potential, so that in each case a charge carrier type is blocked in the case of transfer from a nanowire part to an adjacent nanowire part. As a result of the respective actuation of the gate contacts and the potential ratios of the respective Schottky contacts with respect to one another, the functionality of the circuit can be varied and is not fixed permanently as in conventional integrated circuits in CMOS technology due to the doping which was carried out once during the manufacturing process. Due to the adjustable interconnection, it is possible, for example, to implement a component with logical functions, for example, OR function, MUX function, so that an increased functionality of a single circuit implemented in hardware is achieved.

Accordingly, in a particularly advantageous manner, depending on a wiring of the top-gate contacts and/or back-gate contacts and the potential ratios of the respective Schottky contacts with respect to one another, a logical circuit is formed from different function members. Therefore, the connections of the individual vertical nanowire parts can be controlled simply via the back-gate contacts or top-gate contacts. Thus, the array of vertical nanowire parts can be variably interconnected by wiring as desired, via a matrix of linearly intersecting back- or top-gate contacts, so that dynamic wiring becomes possible, the state of which, in addition, can be stored by means of ferroelectric materials.

As a function of the potential ratios of the respective Schottky contacts with respect to one another, i.e., depending on the design or wiring of the nanowire parts as source and/or drain contact, a logical circuit is formed, which can thus be adjustably interconnected and varied.

BRIEF DESCRIPTION OF THE DRAWING FIGURES

Below, the invention will be explained in greater detail in reference to several embodiment examples. The figures show.

DETAILED DESCRIPTION

Figure 4:
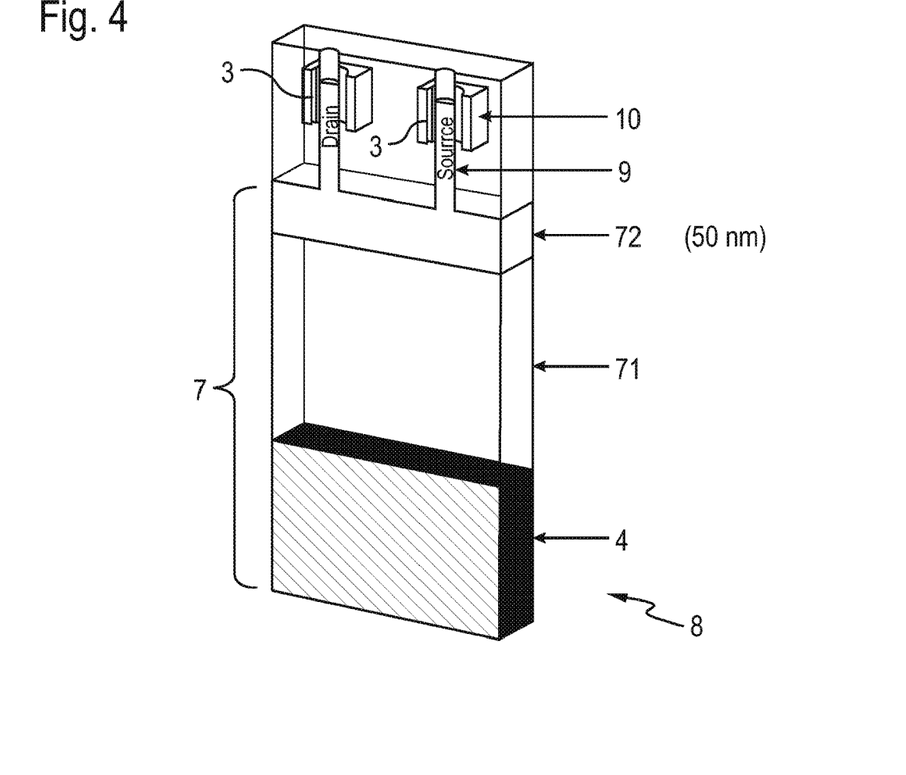
FIG. 4 a vertical integration of a reconfigurable field effect transistor according to the invention.

FIG. 4 shows the vertical integration of a reconfigurable field effect transistor (RFET) 8 according to the invention, which is made from two nanowire parts 9 formed as a source or drain contact 3, which are connected via a common substrate 7 and arranged vertically on this substrate 7. Via a back-gate contact 4, the load carrier transport can be operated and controlled, wherein the combination of different nanowire parts 9 to form an RFET 8 or complex logical functions can thus be controlled together. Due to the vertical integration, the scaling is no longer bound to transistor length, which considerably simplifies the production process, since it is precisely the scaling that already reaches its physical limits according to MOORE's law. Due to the connection of the respective separately gated 10 nanowire parts 9 via the common substrate 7, it is possible to combine several of these nanowire parts 9 to one another. In addition, in the case of vertical integration, one is quite free to select the height of the component. This in turn makes room for tolerances, such as the overlap of Schottky barrier 6 and gate contacts 10.

Figure 5:
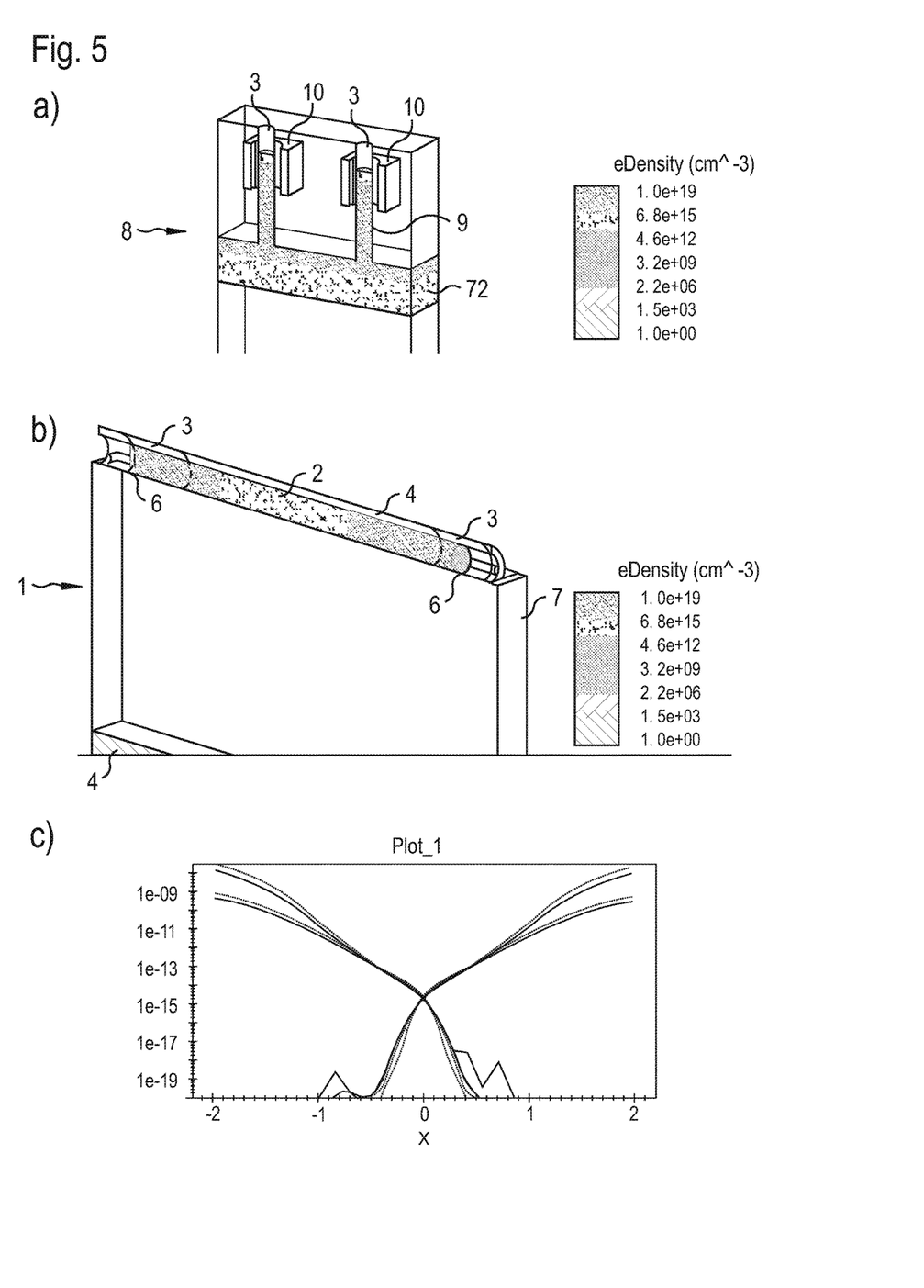
FIG. 5 a comparison of the wiring characteristic (c) of a horizontally (b) and a vertically (a) integrated RFET.

FIG. 5 shows a comparison between the wiring characteristic of a horizontally 1 and a vertically 8 integrated RFET. The wiring characteristic is similar, wherein, in the case of the vertical 8 integration, slightly higher currents are reached due to the improved gate coupling 10. The improved gate coupling is the result of the complete enclosure of the source or drain contact 3 by the respective surround gate 10.

Figure 6:
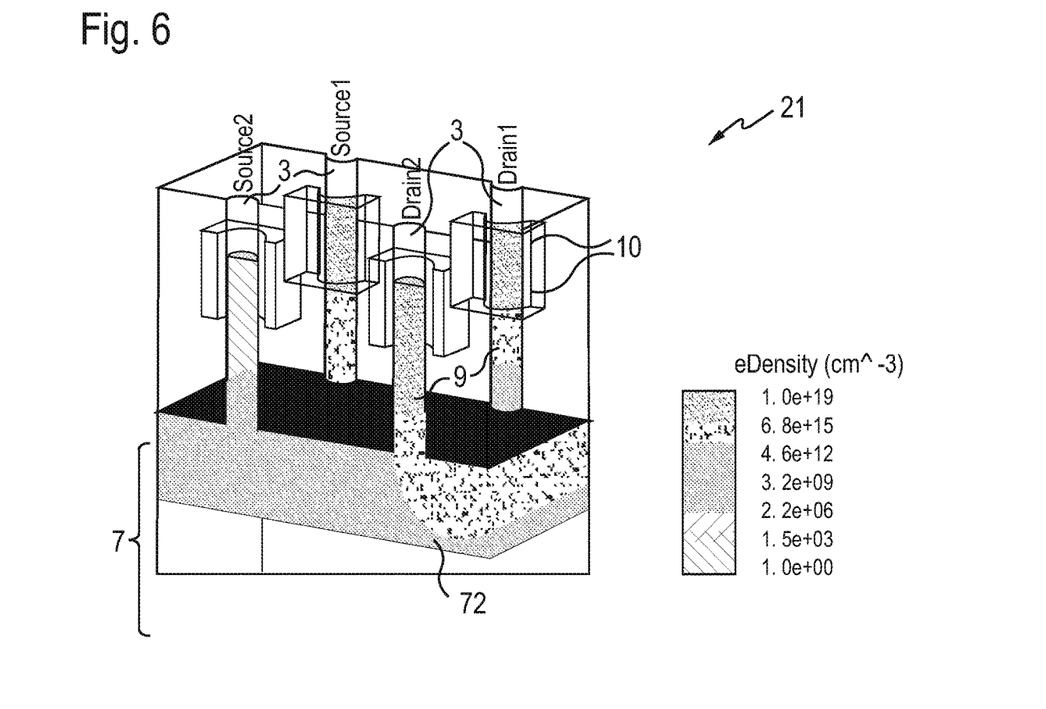
FIG. 6 a diagrammatic representation of a nanowire-parts-array consisting of four nanowire parts, of which two nanowire parts are formed as source contact and two nanowire parts are formed as drain contact.

FIG. 6 shows the diagrammatic representation of the nanowire-parts-array 21 consisting of four nanowire parts 9, wherein two nanowire parts 9 are formed as source contact and two nanowire parts are formed as drain contact. These four nanowire parts 9 are connected to one another via a common substrate 7. Due to the adjustable wiring of the contacts, different logical functions, for example, a multiplexer (MUX) function or an OR logical function, can be constructed with the nanowire-parts-array 21.

Figure 7:
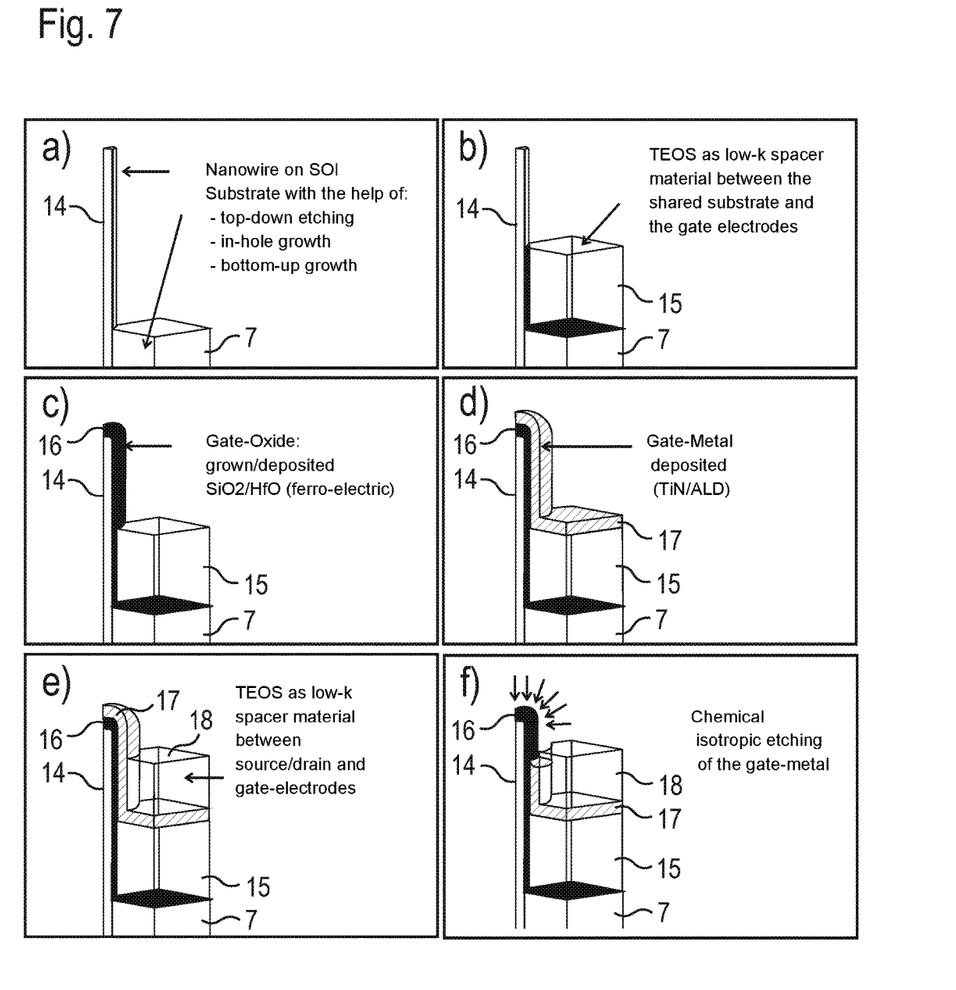
FIG. 7 a method according to the invention for producing a vertically integrated reconfigurable field effect transistor consisting of nanowires (sequential representation of the essential production steps a) to m))

In FIG. 7, a method for producing the vertical configurable field effect transistor 8 according to the invention in individual essential process steps is represented. To improve the presentability, only a fourth of the structure to be produced is shown. In a first process step (FIG. 7a), a nanowire 14 is formed on a silicon-on-isolator (SOI) substrate 7. This can occur by top-down etching, bottom-up growth or preferably in-hole growth. The SOI substrate with a crystal orientation of <110>, for example, comprises, for example, a back-gate, a 200 nm thick oxide layer and a 50 nm thick silicon layer on which the nanowire parts (having a length of 100 nm, for example) are formed vertically. Subsequently (FIG. 7b), a low-k material 15 is applied as spacer between the SOI substrate 7 and a subsequent gate contact 16, 17. For this purpose it is possible to use tetraethyl orthosilicate (abbreviated: TEOS), for example. After the growth or deposition of the gate oxide 16 (FIG. 7c), for the purpose of which SiO2/HfO can be used as ferroelectric material, for example, and after the application of the gate metal 17 (for example, TiN) by atom layer deposition (ALD) (FIG. 7d), a second low-k material 18, TEOS again, for example, is deposited between the gate contact 16, 17 and a Schottky contact which subsequently forms either the source or the grain contact 3. The TEOS is used again as spacer between the source and/or drain contact 3 and the respective gate electrode 16, 17 (FIG. 7e). Subsequently, the gate oxide 16 is chemically exposed by isotropic etching of the gate metal 17 (FIG. 7f). By reactive ion etching (RIE), the gate oxide 16 is etched anisotropically, so that the upper end of the silicon nanowire part 14, which is spaced from the SOI substrate 7, is exposed (FIG. 7g). Subsequently, the remaining filling of the area surrounding the nanowire part 14 with TEOS as low-k spacer 18 occurs between the source and/or drain contact 3 to be formed and the produced gate contact 10 which completely surrounds the nanowire part 9, 14 (FIG. 7h). Since the upper end of the silicon nanowire part 14, which is spaced from the SOI substrate 7, is now covered again with TEOS, the end has to be exposed again. This occurs by chemical-mechanical polishing (CMP) (FIG. 7i).

Subsequently, a nickel layer 19 is deposited (FIG. 7j), which is necessary for the subsequent silicidation. In the silicidation, the nickel 19 reacts by rapid thermal annealing, for example, at a temperature of 500° C. with the silicon of the nanowire part 14 (FIG. 7k). Due to the deposited amount of nickel 19, the silicidation is self-limiting, i.e., by way of the amount of nickel 19, the position of the Schottky barriers 6 with respect to an end—formed at a distance from the substrate—of the nanowire part 9, 14 standing vertically on the substrate can be defined and set exactly. The more nickel is deposited, the deeper the silicidation 20 into the nanowire part 14 occurs, and the deeper the position of the Schottky barrier 6 is. Therefore, in the production method according to the invention, it is particularly advantageous if the silicidation 20 of the Schottky contact is carried out as last production step. This does in fact simplify the production and increase the reliability of the structure, since the need for subsequent process steps, which would continue to have an effect on the silicides formed, is dispensed with. Thus, a simplified integration of the Schottky barriers is made possible. Subsequently, the nickel layer 19 is removed (FIG. 7m).

Figure 8:
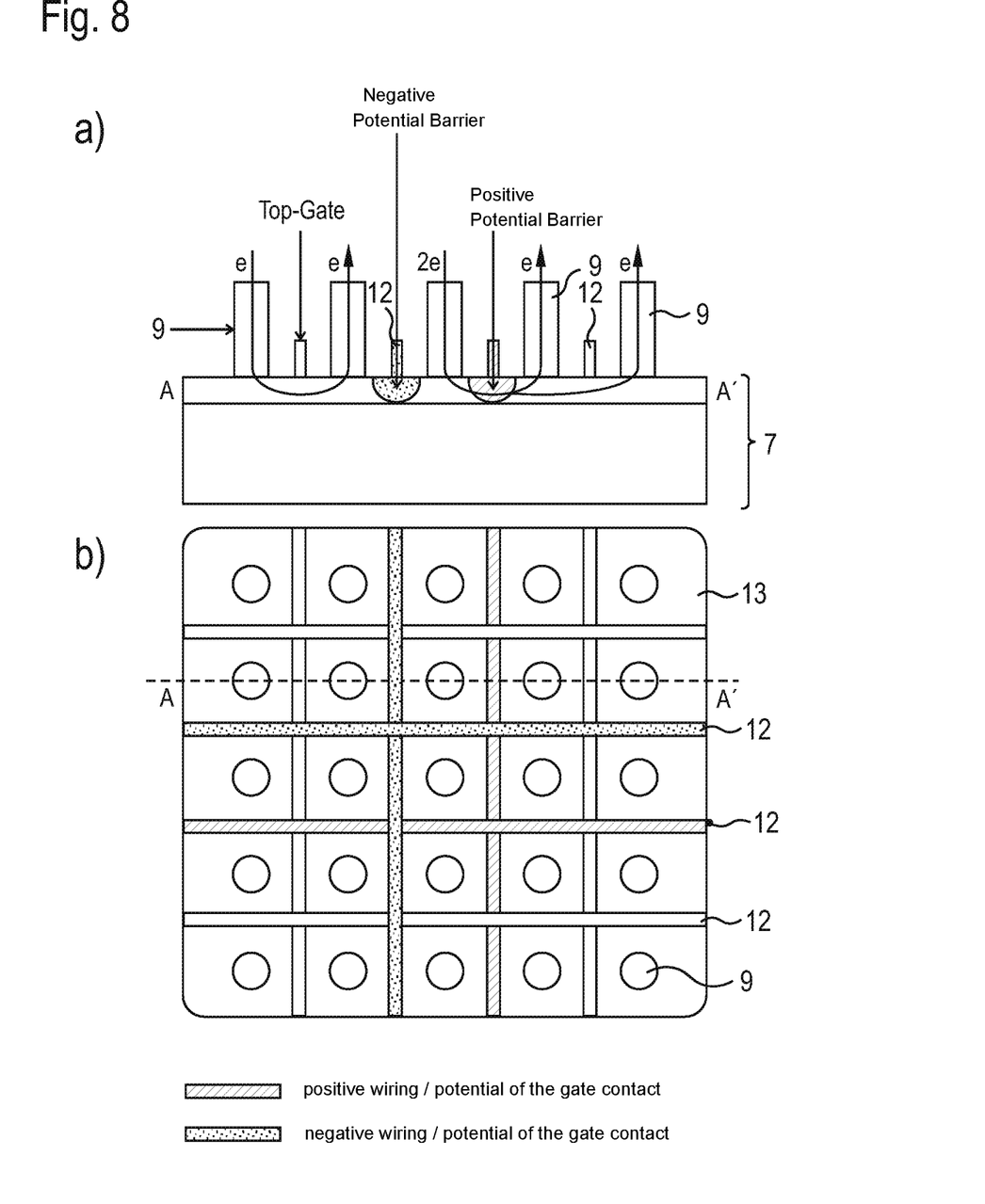
FIG. 8 a dynamic reconfigurable actuation of a nanowire-parts-array according to the invention, a) cross section through the nanowire-parts-array structure, b) top view onto the nanowire-parts-array.

FIG. 8 shows an exemplary diagrammatic representation of the nanowire-parts-array 21 according to the invention. Here, FIG. 8b shows a top view, wherein five times five nanowire parts 9 are arranged in an array on a common substrate 7. Between the nanowire parts 9, a respective top-gate contact and/or back-gate contact 12 is/are formed in the substrate 7 defining a substrate plane. A top-gate contact 12 is arranged on the substrate top side, i.e., the side on which the nanowire parts are arranged, whereas a back-gate contact is arranged on the substrate back side, i.e., the side of the substrate 7 facing away from the nanowire parts 9. FIG. 8a shows the arrangement in cross section along section A-A'. Depending on the wiring of the respective top-gate contact and/or back-gate contact 12 formed between the nanowire parts 9 with a positive potential (for example, a dashed surface) or a negative potential (for example, dotted surface), a respective load carrier type is barred in the case of a transfer from one nanowire part 9 to an adjacent nanowire part 9. Therefore, the connections of the individual vertical nanowire parts 9 can be controlled easily via the back-gate contacts or top-gate contacts 12. Thus, the array 21 of vertical nanowire parts 9 can be variably wired to one another as desired via a matrix of linearly crossing back- or top-gate contacts 12, so that dynamic wiring becomes possible, the state of which, in addition, can be stored by means of ferroelectric materials.

Figure 9:
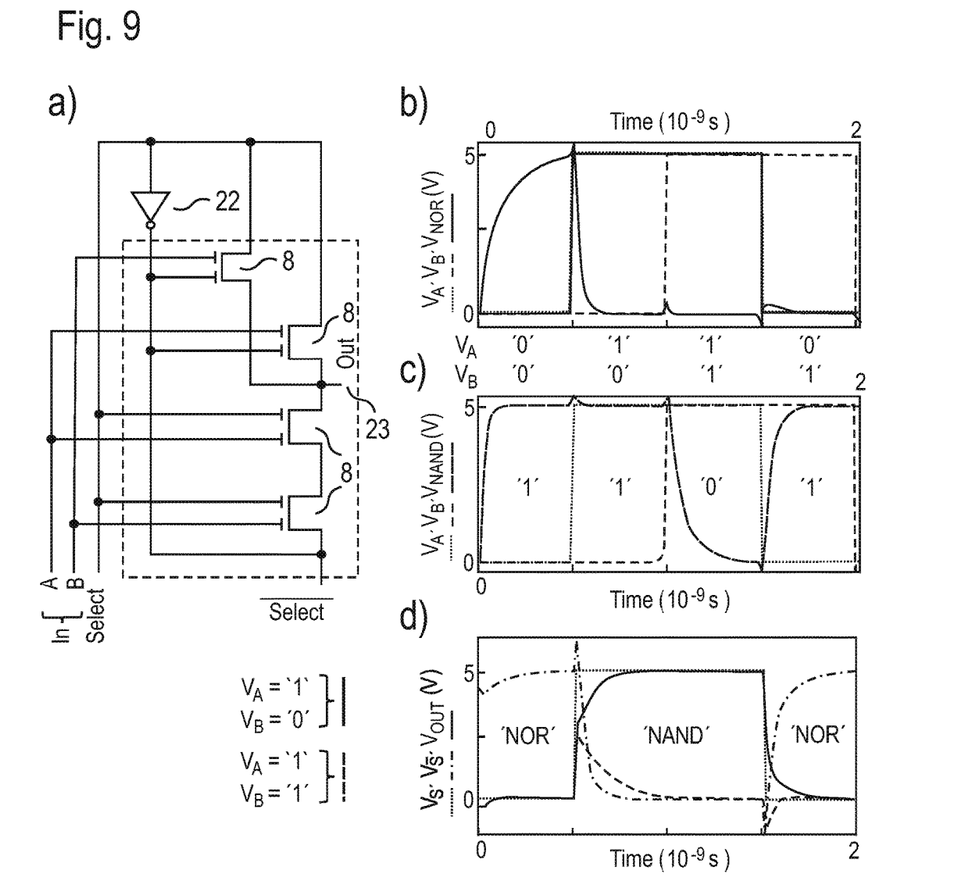
FIG. 9 an exemplary wiring of the nanowire-parts-array according to the invention to form a reconfigurable NAND/NOR circuit.

FIG. 9 shows an exemplary wiring of the nanowire-parts-arrays 21 according to the invention in order to form a reconfigurable NAND/NOR circuit. The area in FIG. 9a surrounded by a dashed line comprises four reconfigurable field effect transistors 8 with two input signals A and B. Here, the purpose of the inverter is to control the polarity of the devices and to switch back and forth between the reference voltage $V_{DD}$ and GND as a function of the select signal. FIGS. 9b and 9c show the output signal 23 of the circuit, when the circuit works as NOR (b) or as NAND (c) logic. FIG. 9d shows the dynamic alternation of the output signal 23 of the circuit as a function of the applied select signal.

List of Reference Numerals

1 Reconfigurable field effect transistor (RFET)
2 Nanowire
3 Source and/or drain contact
4 Gate contact
41 Programmed gate contact
42 Control gate contact
5 Transistor channel
6 Schottky barrier, Schottky contact
7 SOI substrate or GOI substrate
71 Oxide
72 Silicon or germanium
73 Silicon dioxide
8 Vertical reconfigurable field effect transistor
9 Vertical nanowire part
10 Surround gate contact
11 Common substrate
12 Linear gate contact, either top-gate or back-gate
13 Grid field
14 Nanowire
15 First low-k spacer material
16 Gate oxide
17 Gate metal
18 Second low-k spacer material
19 Nickel layer
20 Silicidation of the source/drain contacts
21 Nanowire-parts-array
22 Inverter
23 Output signal

The invention claimed is:

1. A reconfigurable field effect transistor (RFET) comprising: a nanowire, wherein the nanowire comprises two Schottky contacts, and two gate contacts partially enclosing the nanowire along an outer periphery of the nanowire, wherein the nanowire is divided along a cross section of the nanowire perpendicularly to a longitudinal extent of the nanowire into two nanowire parts, wherein each nanowire part comprises a respective Schottky contact and a respective gate contact;
the reconfigurable field effect transistor further includes a transistor portion electrically connecting the two nanowire parts to one another, and wherein the transistor portion is part of a common substrate, and wherein the two nanowire parts stand vertically on the substrate; and
wherein the two gate contacts comprise a program gate contact and a control gate contact, the program gate contact and the control gate contact being electrically isolated from each other.

2. The reconfigurable field effect transistor according to claim 1, wherein the gate contact completely encloses the nanowire part along the outer periphery of the nanowire.

3. The reconfigurable field effect transistor according to claim 1, wherein the Schottky contact comprises one of a drain contact or a source contact depending on a control of the respective gate contact.

4. The reconfigurable field effect transistor according to claim 1, wherein the nanowire parts and the transistor portion comprise one of silicon or germanium, and the substrate comprises one of a silicon-on-isolator (SOI) substrate or a germanium-on-isolator substrate.

5. The reconfigurable field effect transistor according to claim 1, wherein the transistor portion comprises a semiconducting layer insulated electrically from the rest of the substrate.

6. The nanowire-parts-array according claim 5, wherein the nanowire array comprises an integrated logical circuit.

7. The nanowire-parts-array according to claim 5, wherein the nanowire-parts-array comprises one of an even or odd number of nanowire parts.

8. The reconfigurable field effect transistor according to claim 1, wherein the portion comprises a part of the nanowire on which the two nanowire parts stand vertically.

9. A nanowire-parts-array comprising at least two of the nanowire parts according to claim 1, and further including, between the nanowire parts, at least one of a respective top-gate contact and a back-gate contact in the substrate defining a substrate plane.

10. The nanowire-parts-array according to claim 9, wherein top-gate contacts and/or back-gate contacts are arranged linearly on an upper (top) side and/or a lower (back) side of the substrate plane, respectively, and wherein more than two top-gate contacts or back-gate contacts cross forming a grid field, and a respective nanowire part is arranged in a grid field.

11. An integrated circuit, wherein the integrated circuit comprises at least one of a reconfigurable field effect transistor (RFET) according to claim 1 and a nanowire-parts-array comprising at least two of the nanowire parts according to claim 1, and further including, between the nanowire parts, at least one of a respective top-gate contact and a back-gate contact in the substrate defining a substrate plan.

12. The integrated circuit according to claim 11, wherein the integrated circuit comprises a reconfigurable transistor circuit.

13. The reconfigurable field effect transistor according to claim 1, wherein the program gate contact is operable to select predominant charge carriers in each of the nanowire parts and the control gate contact is operable to control a concentration of the predominant charge carriers in each of the nanowire parts.

14. The reconfigurable field effect transistor according to claim 13, wherein:
- a first applied voltage applied to the program gate contact enables the program gate contact to select the predominant charge carriers in each of the nanowire parts;
- a second applied voltage applied to the control gate contact enables the control gate contact to control the concentration of the predominant charge carriers in each of the nanowire parts; and
- the first applied voltage is different from the second applied voltage.

* * * * *